United States Patent
Mauder et al.

(10) Patent No.: US 9,219,149 B2
(45) Date of Patent: Dec. 22, 2015

(54) SEMICONDUCTOR DEVICE WITH VERTICAL TRANSISTOR CHANNELS AND A COMPENSATION STRUCTURE

(71) Applicant: Infineon Technologies Dresden GmbH, Dresden (DE)

(72) Inventors: Anton Mauder, Kolbermoor (DE); Katarzyna Kowalik-Seidl, Munich (DE); Rolf Weis, Dresden (DE); Uwe Wahl, Munich (DE)

(73) Assignee: Infineon Technologies Dresden GmbH, Dresden (DE)

( * ) Notice: Subject to any disclaimer, the term of this patent is extended or adjusted under 35 U.S.C. 154(b) by 74 days.

(21) Appl. No.: 13/935,628

(22) Filed: Jul. 5, 2013

(65) Prior Publication Data
US 2015/0008517 A1     Jan. 8, 2015

(51) Int. Cl.
*H01L 29/66*     (2006.01)
*H01L 29/78*     (2006.01)

(52) U.S. Cl.
CPC ................... *H01L 29/7827* (2013.01)

(58) Field of Classification Search
CPC .................................. H01L 29/7827
USPC ........................ 257/334, E29.257; 438/270
See application file for complete search history.

(56) References Cited

U.S. PATENT DOCUMENTS

| | | | | |
|---|---|---|---|---|
| 2006/0244054 A1* | 11/2006 | Kobayashi | .................... | 257/329 |
| 2007/0013000 A1* | 1/2007 | Shiraishi | ........................ | 257/341 |
| 2008/0099837 A1* | 5/2008 | Akiyama et al. | .............. | 257/341 |
| 2011/0101452 A1* | 5/2011 | Sonsky et al. | .................. | 257/334 |
| 2012/0043602 A1* | 2/2012 | Zeng et al. | ..................... | 257/330 |
| 2012/0175634 A1 | 7/2012 | Weis | | |
| 2012/0175635 A1 | 7/2012 | Weis | | |

OTHER PUBLICATIONS

Till Schloesser. "Semiconductor Device and Method for Manufacturing a Semiconductor Device." U.S. Appl. No. 13/627,215, filed Sep. 26, 2012.
Joseph Schoenholtz. "Semiconductor Device and Method for Manufacturing a Semiconductor Device." U.S. Appl. No. 13/566,742, filed Aug. 3, 2013.

* cited by examiner

*Primary Examiner* — Matthew Gordon
(74) *Attorney, Agent, or Firm* — Murphy, Bilak & Homiller, PLLC

(57) ABSTRACT

A semiconductor device includes transistor cells with vertical channels perpendicular to a first surface of a semiconductor portion. A buried compensation structure in the semiconductor portion between the transistor cells and a second surface of the semiconductor portion parallel to the first surface includes first areas and second areas. The first and second areas are alternatingly arranged along a lateral direction parallel to the first surface. A contiguous impurity layer of a first conductivity type separates the transistor cells from the buried compensation structure.

18 Claims, 8 Drawing Sheets

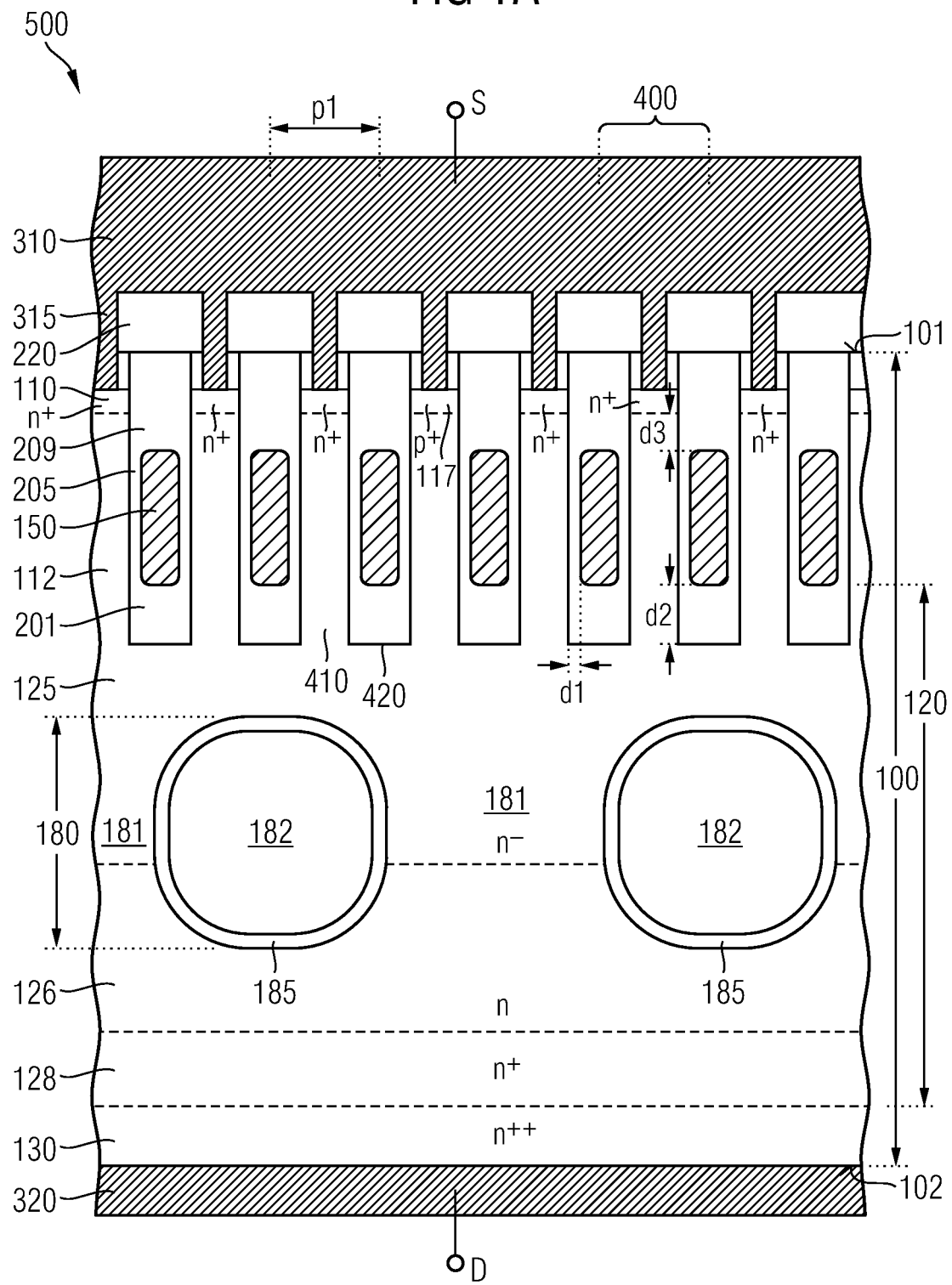

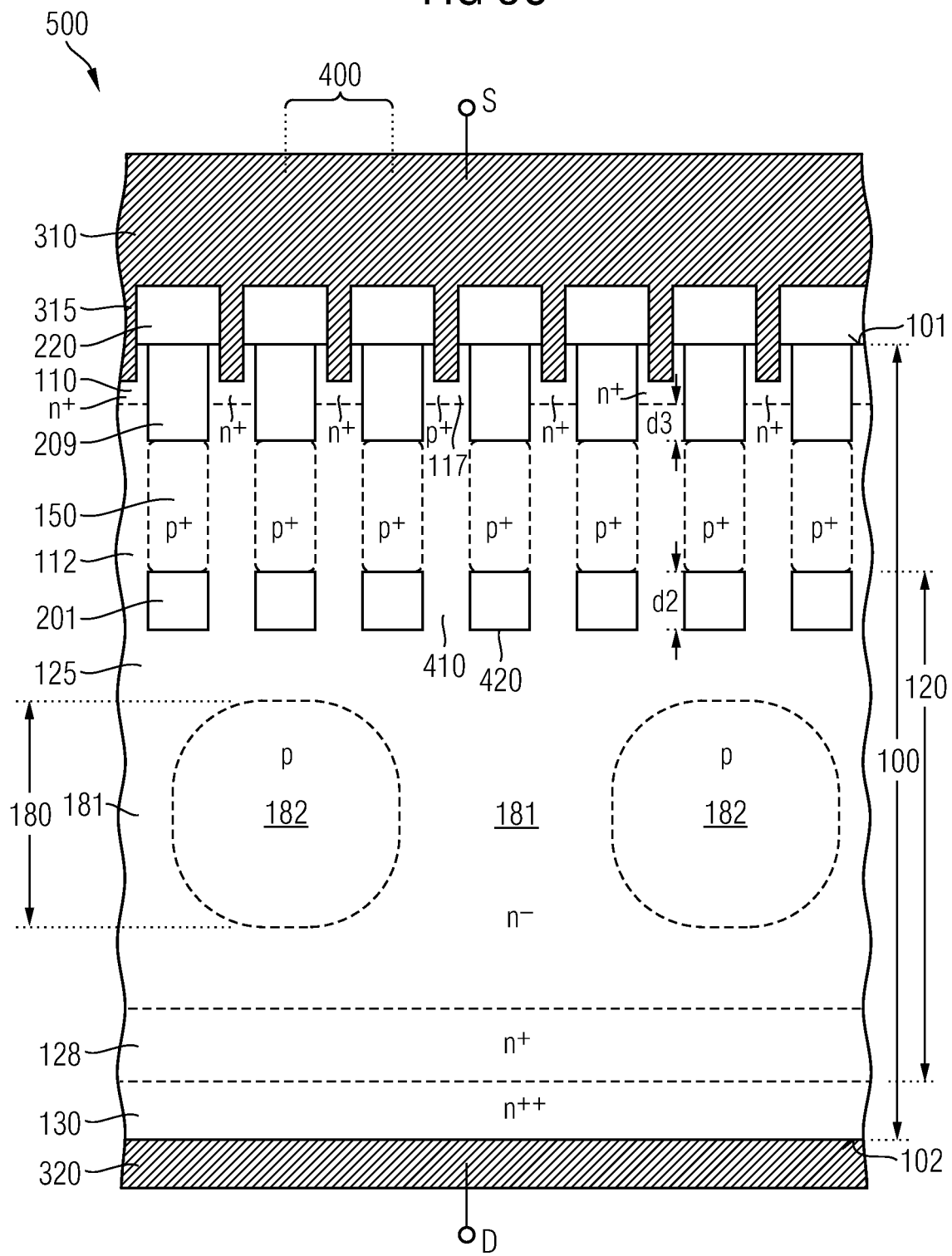

US 9,219,149 B2

SEMICONDUCTOR DEVICE WITH VERTICAL TRANSISTOR CHANNELS AND A COMPENSATION STRUCTURE

BACKGROUND

Semiconductor devices based on vertical transistor cells typically include cell trench structures with buried electrodes and semiconductor mesas between the cell trench structures. It is desirable to provide semiconductor devices including vertical transistor cells with enhanced device characteristics.

SUMMARY

An embodiment refers to a semiconductor device including transistor cells with vertical channels perpendicular to a first surface of a semiconductor portion. A buried compensation structure in the semiconductor portion between the transistor cells and a second surface of the semiconductor portion parallel to the first surface includes first areas and second areas. The first and second areas are alternatingly arranged along a lateral direction parallel to the first surface. A contiguous impurity layer of a first conductivity type separates the transistor cells from the buried compensation structure.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the embodiments. Other embodiments and intended advantages will be readily appreciated as they become better understood by reference to the following detailed description.

FIG. 1A is a schematic cross-sectional view of a portion of a semiconductor device in accordance with an embodiment providing a buried compensation structure with a dielectric layer.

FIG. 3C is a cross-sectional view of a semiconductor device according to an embodiment related to a JFET (junction field effect transistor) and providing a compensation structure with pn junctions.

DETAILED DESCRIPTION

Figure 1B:
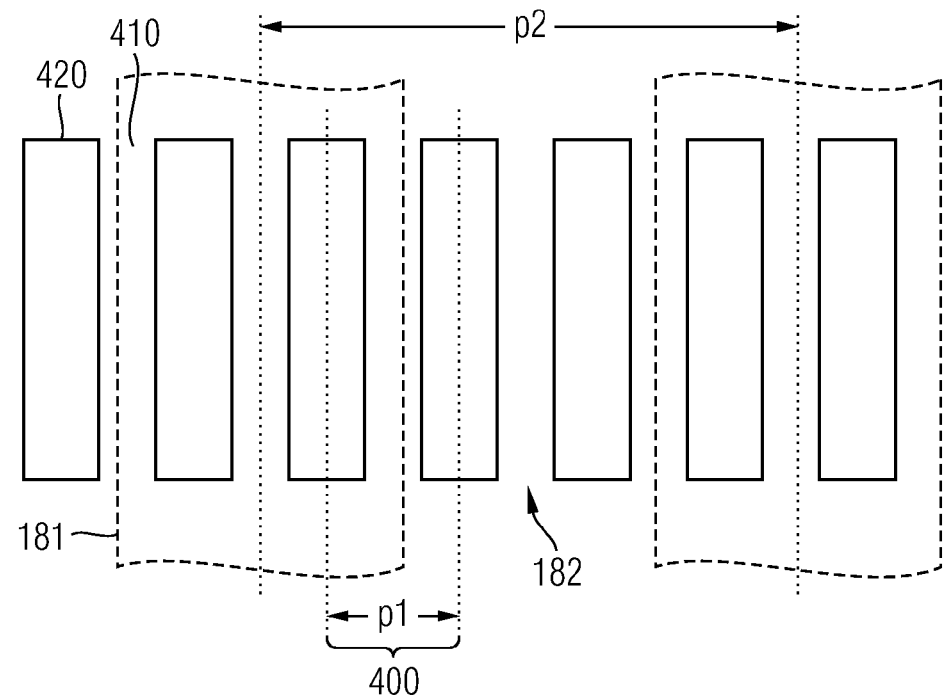
FIG. 1B is a schematic planar cross-sectional view of the semiconductor device of FIG. 1A with the compensation structure oriented parallel to the transistor cells.

In the following detailed description, reference is made to the accompanying drawings, which form a part hereof, and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language that should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open and the terms indicate the presence of stated structures, elements or features but not preclude additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may be provided between the electrically coupled elements, for example elements that are controllable to temporarily provide a low-ohmic connection in a first state and a high-ohmic electric decoupling in a second state.

The Figures illustrate relative doping concentrations by indicating "−" or "+" next to the doping type "n" or "p". For example, "n$^-$" means a doping concentration that is lower than the doping concentration of an "n"-doping region while an "n$^+$"-doping region has a higher doping concentration than an "n"-doping region. Doping regions of the same relative doping concentration do not necessarily have the same absolute doping concentration. For example, two different "n"-doping regions may have the same or different absolute doping concentrations.

FIG. 1A shows a semiconductor device 500 with a semiconductor portion 100 having a first surface 101 and a second surface 102 parallel to the first surface 101. The semiconductor portion 100 is provided from a single-crystalline semiconductor material, for example silicon Si, silicon carbide SiC, germanium Ge, a silicon germanium crystal SiGe, gallium nitride GaN or gallium arsenide GaAs. A distance between the first and second surfaces 101, 102 is at least 40 µm, for example at least 175 µm. The semiconductor portion 100 may have a rectangular shape with an edge length in the range of several millimeters or a circular shape with a diameter of several millimeters. The normal to the first and second surfaces 101, 102 defines a vertical direction and directions orthogonal to the normal direction are lateral directions.

Close to or adjoining the first surface 101 the semiconductor portion 100 includes transistor cells 400 with vertical channels oriented perpendicular to the first surface 101. In a conductive state of the transistor cells 400, the vertical channels direct an on-state current between source zones and a drift layer along the vertical direction through channel or body zones of the transistor cells 400.

The transistor cells 400 may be JFETs (junction field effect transistors) or IGFETs (insulated gate field effect transistors), for example MOS-FETs (metal oxide semiconductor field effect transistors) of the enhancement or depletion type, wherein the term MOSFET includes both FETs (field effect transistors) with metal gate electrodes and FETs with non-metal electrodes. The semiconductor device 500 may be or may include a JFET, an IGFET or an IGBT (insulated gate bipolar transistors). The embodiment illustrated in FIG. 1A refers to an IGFET of the depletion type.

In the semiconductor portion 100 a buried compensation structure 180 between the transistor cells 400 and the second surface 102 includes first areas 181 and second areas 182. The first and second areas 181, 182 are alternatingly arranged along one lateral direction or along two orthogonal lateral directions. The compensation structure 180 provides a depletion mechanism depleting the first areas 181 in a blocking mode and may rely on an impurity compensation approach (super junction approach) or on a field plate approach. The first areas 181 may be doped regions of the single-crystalline material of the semiconductor portion 100 and have a first conductivity type.

According to impurity compensation approaches the second areas 182 may also be provided from the single-crystalline material of the semiconductor portion 100 and may have a second, complementary conductivity type. According to field plate approaches, the second areas 182 may include, e.g. heavily doped single-crystalline or polycrystalline semiconductor material or a metal, a metal alloy or a metal compound, wherein a dielectric layer 185 dielectrically insulates the conductive material of the second areas 182 from the surrounding semiconductor material of the semiconductor portion 100.

A contiguous impurity layer 125 separates the transistor cells 400 from the buried compensation structure 180. The contiguous impurity layer 125 has the conductivity type of the first areas 181 of the compensation structure 180. The contiguous impurity layer 125 and the compensation structure 180 form a section of a drift layer 120 between the trench transistor cells 400 and a drain layer 130. The contiguous impurity layer 125 decouples the center-to-center distance (pitch) and the orientation of the first and second areas 181, 182 from the pitch and orientation of the transistors cells 400. According to an embodiment, the pitch of the transistor cells 400 can be shrunk to 200 nm and less.

In case the semiconductor device 500 is or includes a vertical IGFET or a vertical JFET, the drain layer 130 is a heavily doped contact layer directly adjoining the second surface 102. In case the semiconductor device 500 is or includes a vertical IGBT, a heavily doped collector layer of a conductivity type opposite to that of the drain layer 130 may separate the drain layer 130 from the second surface 102.

In case the semiconductor device 500 is or includes a lateral IGFET or IGBT with the transistor cells 400 providing part of an active drift zone, the drain layer 130 is a buried impurity layer formed at a distance to the second surface 102, wherein connection plugs electrically connect the drain layer 130 with conductive structures provided at a side defined by the first surface 101.

The drift layer 120 may further include a contiguous base layer 126 between the compensation structure 180 and the drain layer 130. The contiguous impurity layer 125, the first areas 181 and the contiguous base layer 126 may have the same mean net impurity concentration. According to other embodiments the mean net impurity concentration in the contiguous impurity layer 125, the first areas 181 and the contiguous base layer 126 increases gradually and/or in steps with increasing distance to the first surface 101. According to other embodiments the mean net impurity concentration in the contiguous impurity layer 125 decreases gradually and/or in steps with increasing distance to the first surface 101 and the mean net impurity concentration in the first areas 181 and the contiguous base layer 126 increases gradually and/or in steps with increasing distance to the first surface 101.

A mean net impurity concentration in the drain layer 130 may be at least $1 \times 10^{16}$ cm$^{-3}$, for example at least $5 \times 10^{17}$ cm$^{-3}$. The drift layer 120 may include a pedestal layer 128 directly adjoining the drain layer 130. The pedestal layer 128 may be effective as a field stop, wherein a mean net impurity concentration in the pedestal layer 128 may be between $5 \times 10^{15}$ cm$^{-3}$ and $5 \times 10^{17}$ cm$^{-3}$ and the mean net impurity concentration in portions of the drift layer 120 outside the pedestal layer 128 is lower than in the pedestal layer 128. For example, the mean net impurity concentration in a pedestal layer 128 effective as a field stop may exceed at least five times the mean net impurity concentration in the drift layer 120 outside the pedestal layer 128 which may be between $5 \times 10^{13}$ cm$^{-3}$ and $5 \times 10^{16}$ cm$^{-3}$, by way of example. According to other embodiments, the pedestal layer 128 may be a buffer layer having a mean net impurity concentration lower than in other portions of the drift layer 120. For example, the mean net impurity concentration in the drift layer 120 outside the pedestal layer 128 exceeds at least three times the mean net impurity concentration in the pedestal layer 128.

The transistor cells 400 include cell trench structures 420 with buried gate electrodes 150 and semiconductor mesas 410 including the active transistor areas between the cell trench structures 420. The cell trench structures 420 and the semiconductor mesas 410 alternate along one lateral direction or along two orthogonal lateral directions.

For a respective transistor cell 400, a gate dielectric 205 with a first thickness d1 may separate the gate electrode 150 from the adjoining semiconductor mesas 420. The first thickness may be between 5 and 200 nm, by way of example. In addition, a field dielectric 201 with a second thickness d2 separates the respective gate electrode 150 from the contiguous impurity layer 125. The thickness of a cap dielectric 209 between the first surface 101 and the gate electrodes 150 defines a distance d3 between heavily doped source zones 110 in the active transistor areas of the semiconductor mesas 420 and the gate electrodes 150. Each of the gate, field and cap dielectrics 205, 201, 209 may consist of or contain a dielectric, e.g. thermally grown semiconductor oxide, e.g. silicon oxide, or deposited semiconductor oxide, e.g. silicon oxide using TEOS (tetraethyl orthosilicate) or silane as a precursor material, or both.

According to other embodiments, one or more of the dielectrics 201, 205, 209 may include or consist of a layer of dielectrics which may consist of e.g. semiconductor oxides or semiconductor oxides and semiconductor nitrides. One or more of the dielectrics 201, 205, 209 may comprise any kind of dielectrics and/or dielectric layers like, e. g. so called high-k dielectrics. Between a first electrode structure 310 and the semiconductor mesas 410 contact structures 315 extend through openings of a dielectric layer 220 that may cover the cell trench structures 420 and portions of the semiconductor mesas 410.

Each active transistor area in the semiconductor mesas 410 includes a source zone 110 of the first conductivity type and a controlled zone separating the source zone 110 from the drift layer 120. The controlled zone may be a channel zone having the same conductivity type as the source zone 110 and the drift layer 120 or a body zone having the complementary conductivity type of the source zone 110 and the drift layer 120. According to an embodiment, the body zone may not extend over the whole depth of the gate electrode and/or the dielectric 209 and/or the dielectric 201.

The transistor cells 400 in the illustrated semiconductor device 500 are n-FET cells of the depletion type with n-type channel zones 112 between the n-type source zones 110 and an n-type drift layer 120 and the first electrode structure 310 may be electrically connected or coupled to a source terminal S. A reference potential, e.g. 0 V, may be applied to the source terminal S.

Heavily p doped contact zones 117 may alternate with the source zones 110 in a direction perpendicular to the cross-sectional plane for each semiconductor mesa 410 and may discharge holes thermally generated in the drift layer 120 in the blocking state.

Since all vertical channels in the semiconductor mesas 420 between the gate electrodes 150 are completely depleted at comparatively low voltages, the voltage drop across the gate dielectric 205 is low and the gate dielectrics 205 may be comparatively thin. Thin gate dielectrics 205 in turn provide a high transistor transconductance and allow for providing the cell trench structures 410 comparatively thin which in turn allows a lower pitch, i.e. narrow center-to-center distances between adjoining cell trench structures 410. Since a narrow pitch increases the overall channel width, a narrow pitch also decreases the on-state resistance.

The field dielectric 201 sustains a voltage difference between the gate electrodes 150 and the compensation structure 180. For an embodiment, said voltage difference may be given by the breakdown voltage specified for the voltage class to which the semiconductor device 500 is assigned. Typically a 500 nm dielectric layer can sustain a 100 V voltage drop when the material is silicon dioxide and long term stress is assumed. For short periods of time a silicon oxide layer may withstand higher voltage drops up to e.g. five times of this value or more. For other dielectric layers the maximum permissible voltage drop may be lower than for silicon dioxide.

For the illustrated embodiment, the second thickness d2 of the field dielectric 201 and the third thickness d3 of the capping dielectric 209 may be at least 500 nm, by way of example. The second thickness d2 of the field dielectric 201 and the third thickness d3 of the capping dielectric 209 may have the same values or may differ from each other and they may depend on the blocking capability $V_B$ of the semiconductor device 500. As a first order approximation the values may be linearly set according to equation (1):

$$d2, d3 \text{ in nanometers (nm)} = 5 * V_B \text{ in volts (V)} \quad (1)$$

The values of d2, d3 may have deviations of −80% up to +500% from the value obtained through equation (1).

Recess processes, which are applied on deposited layers providing the field dielectric 201 and the gate electrodes 150, may be used to adjust the second and third thicknesses d2, d3.

For vertical IGFETs and JFETs, a second electrode structure 320 may directly adjoin the second surface 102 of the semiconductor portion 100 and the heavily doped drain layer 130. In case the semiconductor device 500 is an IGFET, the second electrode structure 320 may be electrically coupled to a drain terminal D. In the blocking mode, a positive potential applied at the drain electrode D may be +100 V or more, whereas the voltage at the gate electrodes 150 is negative and may reach −100 V, by way of example.

In case the semiconductor device 500 is a vertical IGBT, the second electrode structure 320 may be electrically connected to a collector layer formed between the second electrode structure 320 and the drain layer 130 and may be electrically coupled to a collector terminal.

For lateral IGFETs, JFETs and IGFETs including an active drift zone, the second electrode structure 320 may directly adjoin a base section of the semiconductor portion 100 and may be or may be electrically connected to a ground terminal of the semiconductor device 500.

Each of the first and second electrode structures 310, 320 and the contact structure 315 may consist of or contain, as main constituent(s) aluminum Al, copper Cu, or alloys of aluminum or copper, for example AlSi, AlCu or AlSiCu. According to other embodiments, one or both of the first and second electrode structures 310, 320 may contain one or more layers with nickel Ni, titanium Ti, silver Ag, gold Au, platinum Pt, tungsten W and/or palladium Pd as main constituent(s). For example, at least one of the first and second electrode structures 310, 320 includes two or more sub-layers, at least one of the sub-layers containing one or more of Ni, Ti, Ag, Au, Pt, W, and Pd as main constituent(s), e.g. a silicide, a nitride and/or an alloy.

Since the pitch (center-to-center) distance between the transistor cells 400 can be very narrow and a high number of transistor cells 400 can be arranged in parallel in a given chip area, the double-gated transistor cells 400 provide a very low channel resistance. On the other hand, the buried compensation structure 180 adjusts the voltage blocking capabilities without giving restrictions to the number or pitch of transistor cells 400. Where conventional approaches providing double-gated transistor channels provide cell trench structures including both gate electrodes and field electrodes, with the field electrodes providing the desired voltage blocking capabilities, with the pitch of the field electrodes being tied to the pitch of the gate electrodes, with thick field oxides separating the field electrodes from the drift layer 120 and limiting the available overall channel width for the transistor cells 400, the present embodiments decouple the pitch of the transistor cells 400 from the structure providing the voltage blocking capabilities, i.e. the compensation structure 180.

As shown in FIG. 1B a first pitch p1 of the transistor cells 400 may be selected narrower than a second pitch p2 of the second areas 182 of the compensation structure 180. The second pitch p2 is decoupled from the first pitch p1. The first pitch p1 may be selected to optimize a channel resistance in the on-state independent from the second pitch p2. According to an embodiment, the first pitch p1 is 300 nm or less. The second pitch p2 may be at least twice the first pitch p1. The second areas 182 of the compensation structure 180 may run parallel to the cell trench structures 420 as illustrated in FIG. 1B.

Figure 1C:
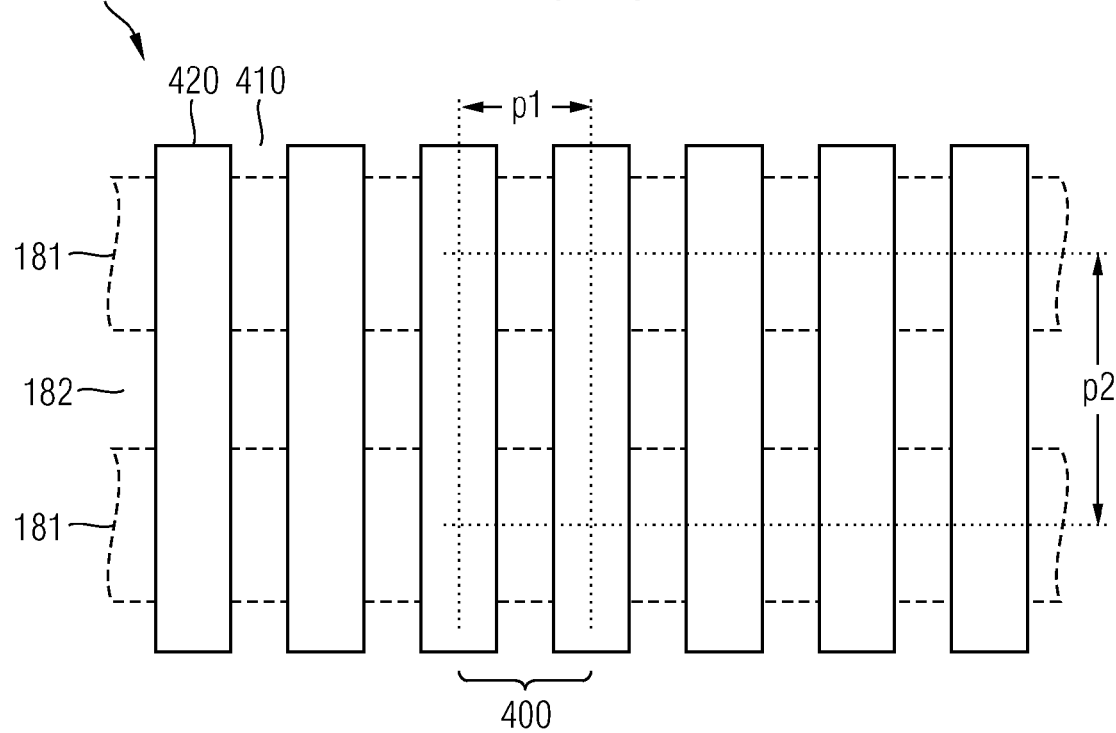
FIG. 1C is a schematic planar cross-sectional view of another semiconductor device with the compensation structure oriented perpendicular to the transistor cells.

In FIG. 1C, the first and second areas 181, 182 of the compensation structure 180 run in a direction intersecting a direction along which the transistor cells 400 extend. According to an embodiment the buried compensation structure 180 and the transistor cells 400 extend along orthogonal directions.

Referring again to FIG. 1A, the contiguous impurity layer 125 distributes the on-state current between the channel zones 112 of the transistor cells 400 and the first areas 181 of the compensation structure 180.

In the compensation structure 180, the lateral integrated impurity concentration in the first areas 181 is approximately equal to the lateral integrated impurity concentration in the second areas 182 at the same distance to the first surface 101 such that the compensation structure 180 may be approximately completely or completely deleted in the blocking state. When integrating the correctly signed impurity concentrations in the first areas 181 and the second areas 182, the permissible maximum value of the absolute value of the integration $c_{max}$ depends on the desired blocking capability $V_B$ of the semiconductor device 500. Equation (2) gives a rule of thumb for the relationship between $c_{max}$ and the blocking capability given by the breakdown voltage $V_B$:

$$c_{max} \approx \frac{10^{17} \text{ cm}^{-3}}{V_B} \qquad (2)$$

In equation (2) the value of $V_B$ is given in volts and the actual value of $c_{max}$ may differ from the value obtained through equation (2) by −50% up to +100%. According to an embodiment the corresponding lateral integrated impurity concentrations in the first and second areas 181, 182 of the compensation structure 180 deviate from each other by not more than ±10% or by not more than ±5%.

Both the first and the second areas 181, 182 of the compensation structure 180 may be provided from a single-crystalline semiconductor material. According to an embodiment, the second areas 182 may be provided by a conductive material like, for example, a non-single crystalline semiconductor material and/or a metal-semiconductor compound like e. g. a silicide and/or a metal. A dielectric layer 185 may separate the second areas 182 from the first areas 181. According to the illustrated embodiment, the dielectric layer 185 dielectrically insulates the second areas 182 from semiconductor material outside the second areas 182 and the drift layer 120. The second areas 182 may be electrically connected to each other and with a further conductive structure. For example, the second areas 182 may be electrically connected with the first electrode structure 310 through a connection structure in a plane parallel to the cross-sectional plane.

According to an embodiment the transistor cells 400 are formed in a cell area surrounded by an edge area that does not include complete and functional transistor cells. The connection structure may be an impurity region of the second conductivity type or may be provided by non single-crystalline material, e.g. heavily doped polycrystalline silicon or a material containing a metal or metal compound.

The connection structure may include one or a plurality of individual connection structures extending from the first surface 101 to the second areas 182 of the compensation structure 180. According to other embodiments the connection structure is a buried structure extending in a direction orthogonal to a lateral direction along which the second areas 182 extend.

According to other embodiments, the second areas 182 of the compensation structure 180 are electrically connected to a further terminal of the semiconductor device 500, wherein the further terminal is electrically insulated from the source terminal S, or to an output terminal of a voltage supply circuit formed in a portion of the semiconductor device 500 outside the illustrated portion.

Figure 2A:
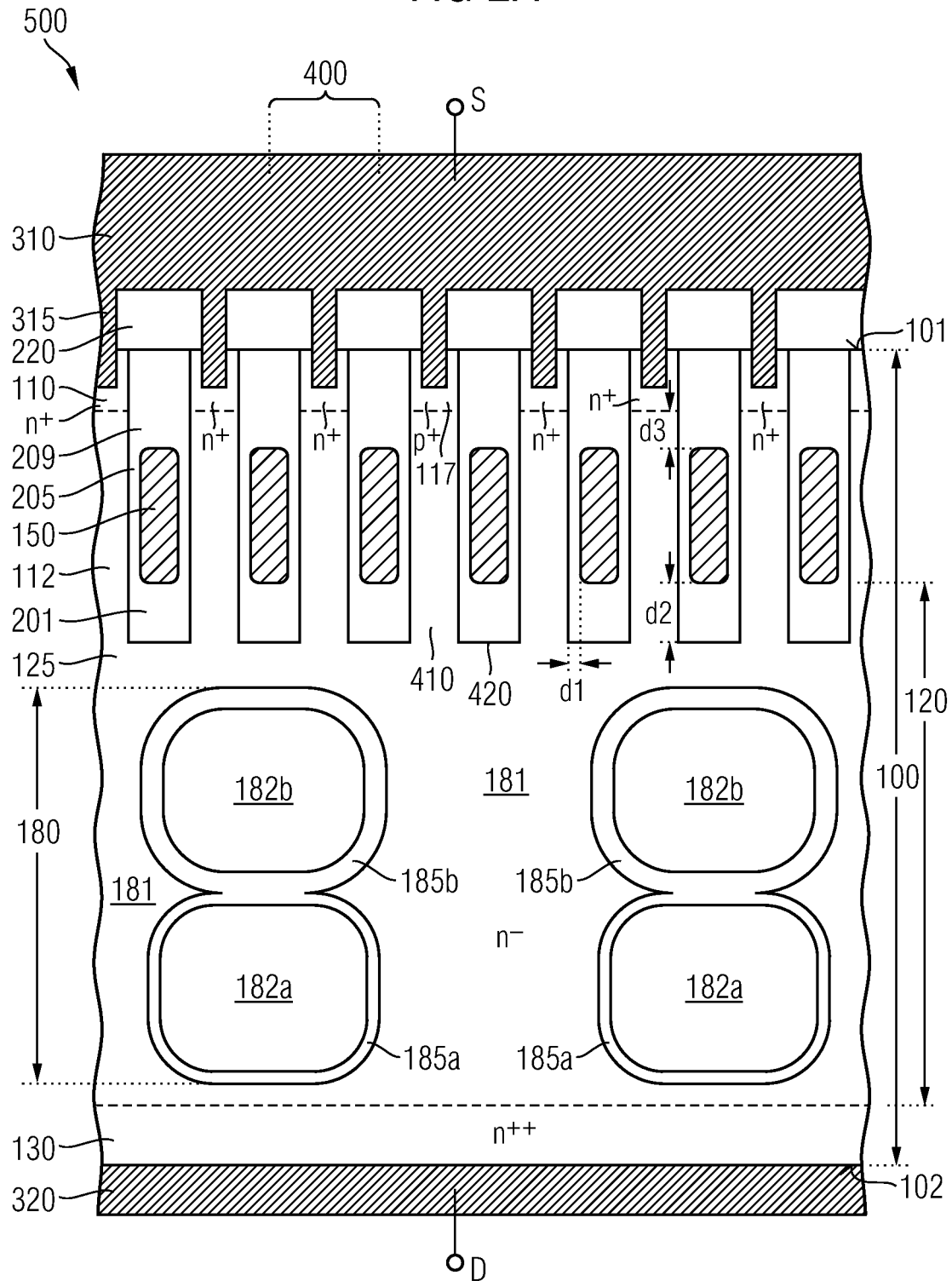
FIG. 2A is a cross-sectional view of a portion of a semiconductor device in accordance with an embodiment providing a compensation structure with dielectrically insulated areas and different field plate potentials.
Figure 2B:
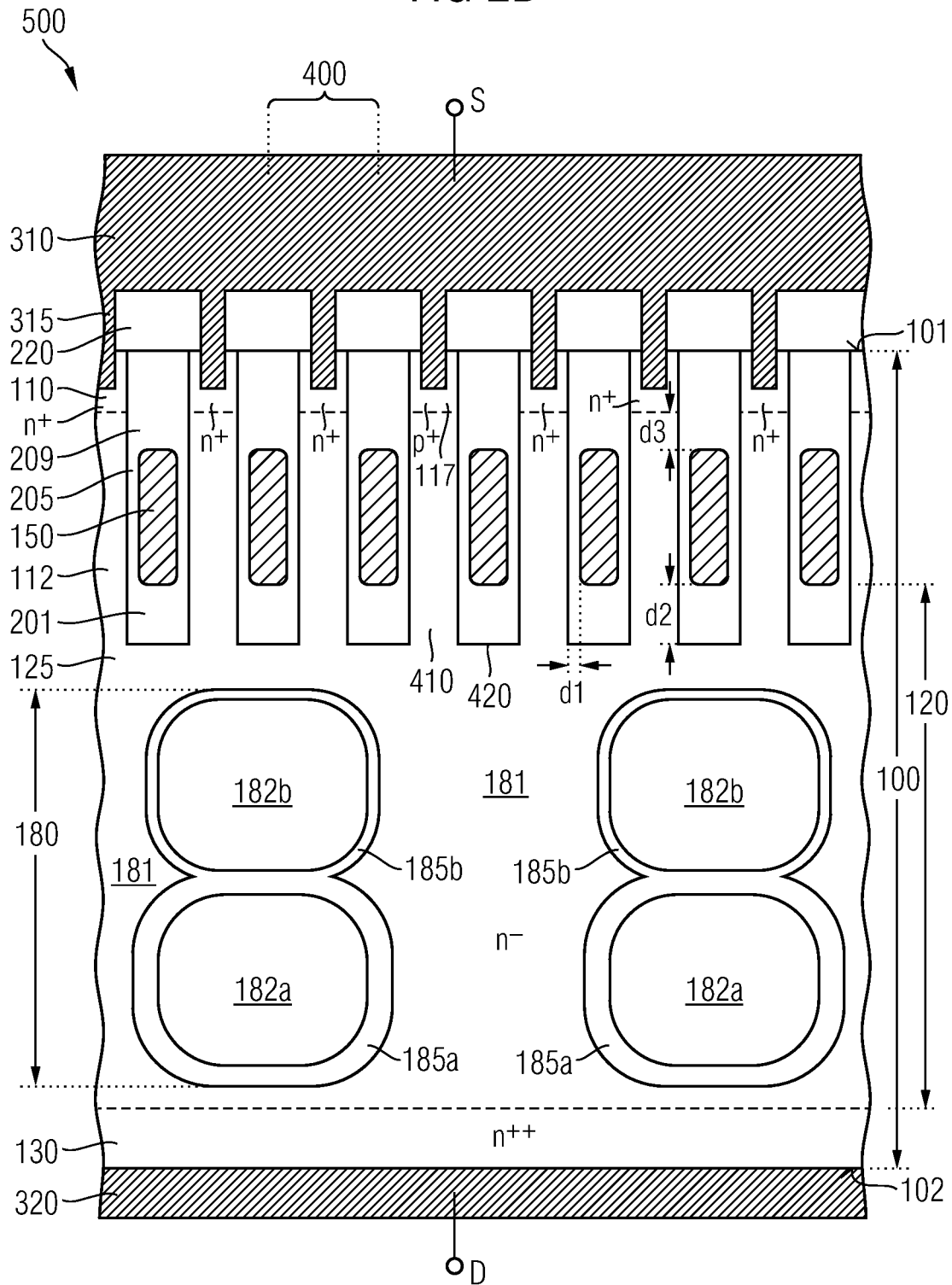
FIG. 2B is a cross-sectional view of a portion of a semiconductor device in accordance with an embodiment providing a compensation structure with dielectrically insulated areas and one single field plate potential.

FIGS. 2A and 2B refer to embodiments according to a field plate approach with the second areas 182 of the compensation structure 180, including at least a first and a second section 182a, 182b respectively. The first and second sections 182a, 182b are arranged along the vertical direction perpendicular to the first surface 101. The first and second sections 182a, 182b may be structurally and electrically connected to each other or may be electrically insulated from each other. Other embodiments may provide the second areas 182 with three, four or more sections, respectively. Further embodiments may provide the second areas 182 with a spacing by sections of the first areas 181 between them in a vertical direction.

FIG. 2A illustrates second areas 182 of the compensation structure 180 with a first section 182a oriented to the second surface 102 and a second section 182b oriented to the first surface 101, respectively. A first dielectric layer 185a dielectrically insulates the first section 182a from the surrounding semiconductor material and a second dielectric layer 185b dielectrically insulates the second section 182b from the surrounding semiconductor material and the first section 182a. The thickness of the first dielectric layer 185a and the thickness of the second dielectric layer 185b may be adjusted according to the difference between the local potential in the first areas 181 and the potential in the corresponding section 182a, 182b of the second areas 182. For example, as a rule of thumb approximately 50 nm of silicon oxide is provided per each 10 V potential difference. During blocking operation of the semiconductor device 500, the voltage drop between drain and source is dissipated in the semiconductor material in the area of the compensation structures 180. Hence, the potential in the semiconductor material varies over the vertical dimension in the compensation structure 180 from the source potential (e.g. 0V) to the drain potential at the drain layer 130.

According to an embodiment, the potential applied to the first sections 182a of the second areas 182 of the compensation structure 180 is less positive than that applied to the second sections 182b. Accordingly, the first dielectric layer 185a may have the same thickness as the second dielectric layer 185b since the maximum potential difference between the first and second sections 182a, 182b and the surrounding semiconductor material may be similar. According to another embodiment, the first dielectric layer 185a may have a thickness differing from the second dielectric layer 185b e, g. may have a smaller thickness as shown in FIG. 2A or also may have a bigger thickness as shown in FIG. 2B.

In FIG. 2B, the same potential, e.g. the source potential of the first electrode structure 310, is applied to the first and second sections 182a, 182b of the second areas 182 of the compensation structure 180. Accordingly, the second dielectric layer 185b may be thinner than the first dielectric layer 185a. According to other embodiments, the first and second dielectric layers 185a, 185b have the same thickness and the same or different potentials are applied to the first and second sections 182a, 182b.

Figure 3A:
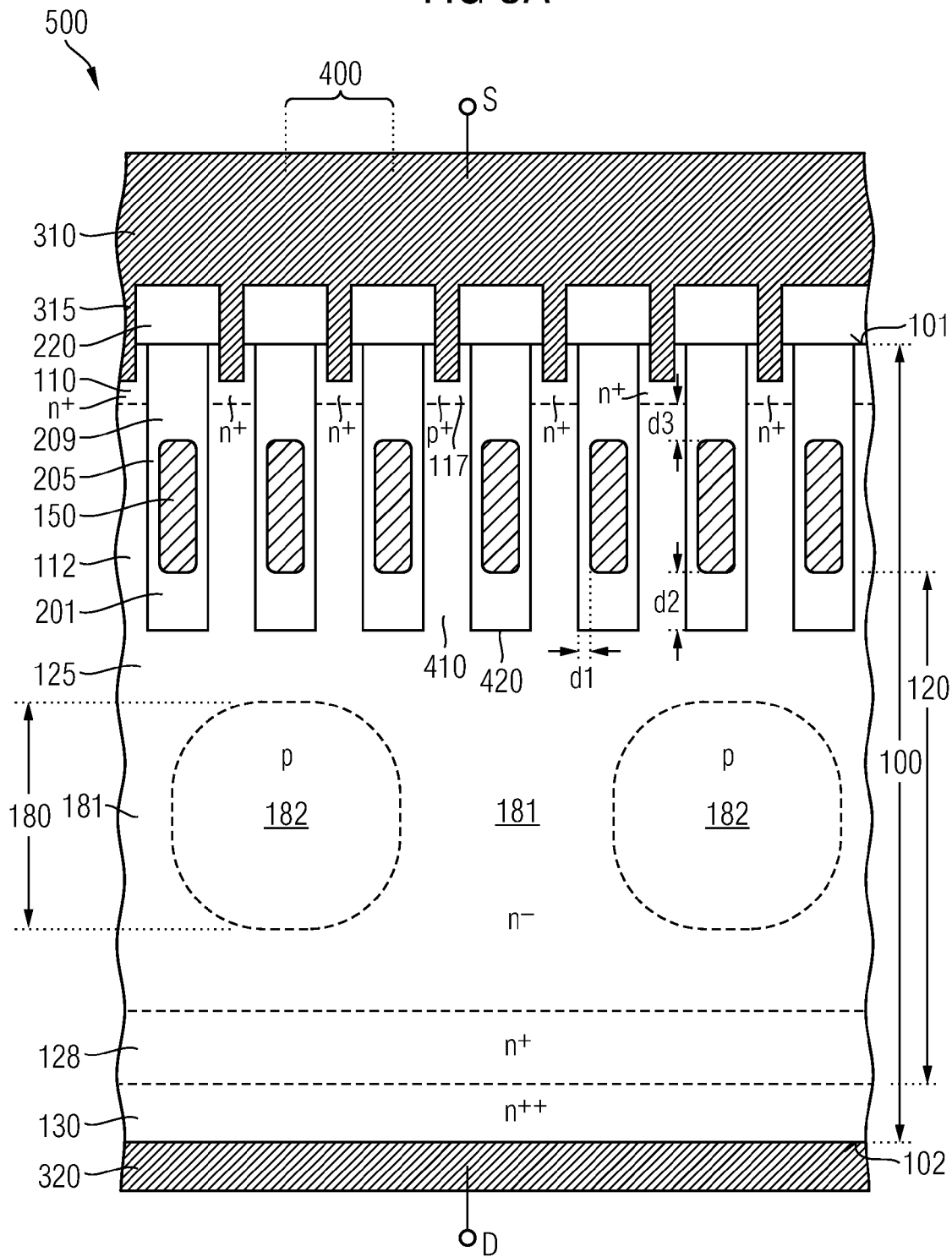
FIG. 3A is a cross-sectional view of a portion of a semiconductor device in accordance with an embodiment related to a depletion type IGFET (insulated gate field effect transistor) and providing a compensation structure with pn junctions.
Figure 3B:
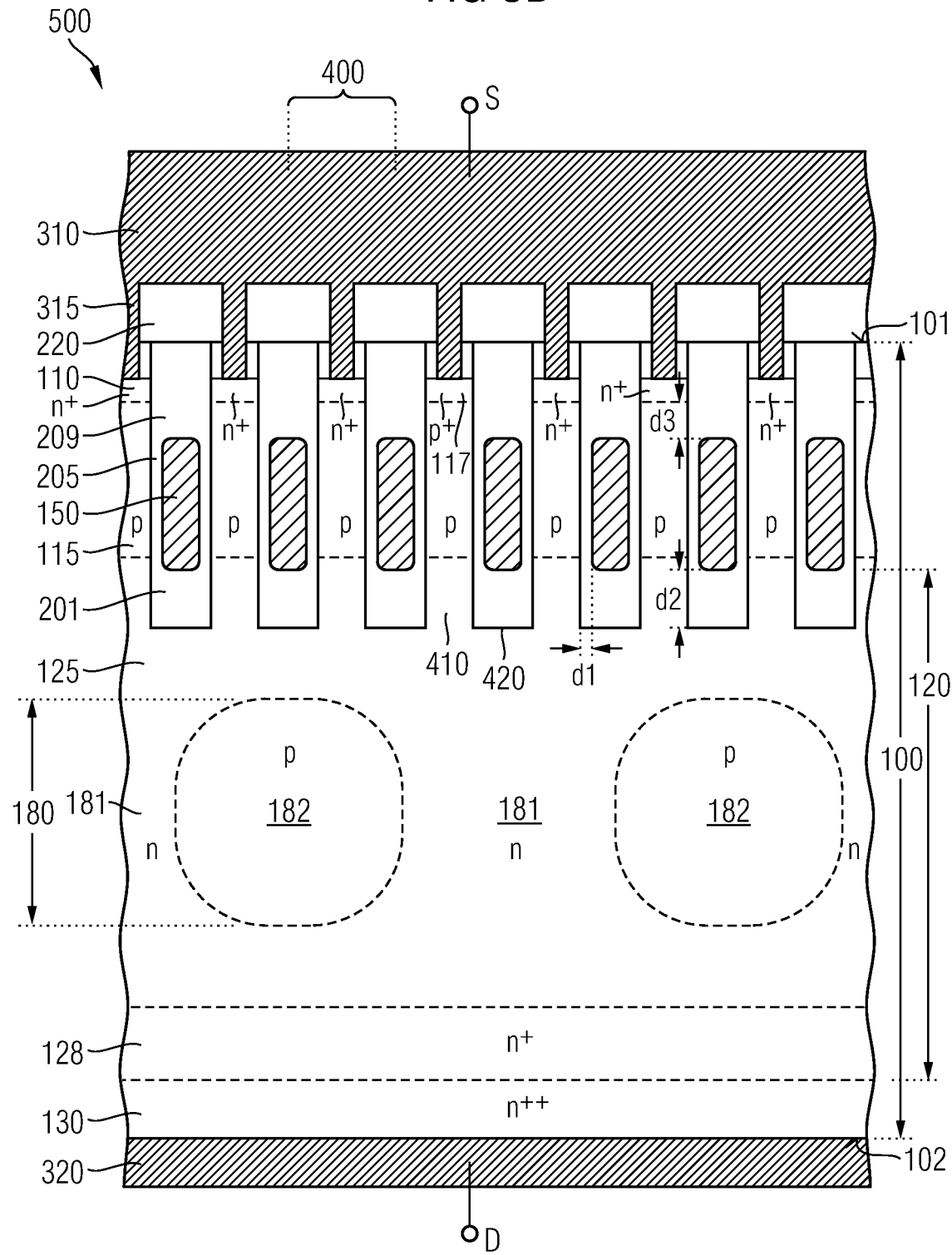
FIG. 3B is a cross-sectional view of a portion of a semiconductor device in accordance with an embodiment related to an enhancement type IGFET (insulated gate field effect transistor) and providing a compensation structure with pn junctions.

The embodiments of FIGS. 3A to 3C refer to compensation structures 180 providing pn junctions between the first and the second areas 181, 182.

The semiconductor device 500 illustrated in FIG. 3A differs from the one illustrated in FIG. 1A in that the second areas 182 directly adjoin the first areas 181 and the first and second areas 181, 182 form respective pn junctions. Holes, which are thermally generated in the blocking state in the drift layer 120, can be drained off through the second areas 182. Other than in the semiconductor device 500 of FIG. 1A, which may include additional contact zones 117 of the p type at the side of the first surface 101, the pn junctions between the first and second areas 181, 182 inherently drain off thermally generated holes without additional effort. Other than embodiments providing a dielectric layer between the first and second areas 181, 182, semiconductor devices 500 with pn junctions between the first and second areas 181, 182 get by without covering the second areas 182 and the first areas 181 with mono-crystalline semiconductor material e.g. by laterally overgrowing using a lateral epitaxy process.

At a specified blocking voltage, the electric field between the first and second areas 181, 182 of the compensation structure 180 does not exceed the vertical electric field strength in the semiconductor material of the drift layer 120, e.g. silicon Si. In other words, the lateral integrated net impurity concentration does not exceed the two-fold of the so-called breakdown charge. Within the first and second areas 181, 182, the net impurity concentration may change both in the lateral and vertical directions, e.g. due to diffusion processes, for providing sufficient blocking capabilities along the vertical direction.

An electrical connection between the second areas 182 of the compensation structure 180 and an active electric circuit or an electrode, for example the first electrode structure 310, may provide a discharge facility for the second areas 182.

FIGS. 3A to 3C illustrate embodiments according to the impurity compensation approach with the first and second areas 181, 182 of the compensation structure 180 having opposite conductivity types and forming pn junctions.

FIG. 3A shows transistor cells 400 providing n-FETs of the depletion type with an n type channel zone 112 between the heavily doped source zone 110 and the drift layer 120. The gate dielectric 205 dielectrically insulates a gate electrode 150 from the channel zone 112. In the blocking state, an electric field generated by the gate electrode 150 fully depletes the channel zone 112 such that no current flows between the heavily doped source zones 110 and the drift layer 120. Heavily doped contact zones 117 of the second conductivity type drain off thermal charge carriers of the p type from the channel zones 112. The contact zones 117 may alternate with the source zones 110 in a direction perpendicular to the cross-sectional plane for each semiconductor mesa 410.

FIG. 3B refers to a semiconductor device 500 with the transistor cells 400 providing n-FETs of the enhancement type. Body zones 115 of the second conductivity type separate the source zones 110 from the drift layer 120. In the conductive state, a potential at the gate electrodes 150 accumulates charge carriers of the first conductivity type along the gate dielectrics 205, wherein the accumulated charge carriers form an accumulation channel. Heavily p doped contact zones 117 for discharging the body zones 115 may alternate with the source zones 110 in a direction perpendicular to the cross-sectional plane for each semiconductor mesa 410.

FIG. 3C refers to a JFET with the gate electrode 150 provided from heavily doped semiconductor material of the second conductivity type. According to an example, the gate electrodes 150 are provided from heavily p doped polycrystalline silicon that directly adjoins the channel zones 112 in the semiconductor mesas 410. The dimensions of the gate electrodes 150 and the impurity concentration in the gate electrodes 150 are selected such that the gate electrodes 150 are not fully depleted at a potential at which the channel zones 112 are fully depleted. The field dielectric 201 dielectrically insulates the gate electrodes 150 from the drain layer 120 and the cap dielectric 209 provides a dielectric separation between the gate electrodes 150 and the heavily doped source zones 110.

Figure 4:
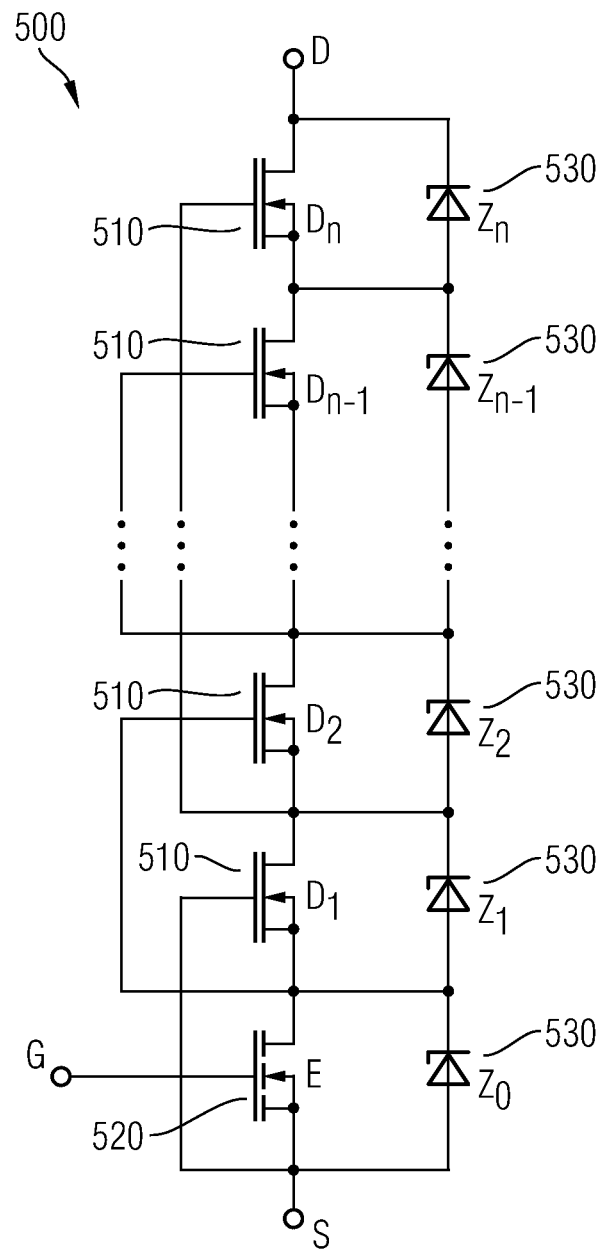
FIG. 4 is a schematic circuit diagram of a semiconductor device in accordance with an embodiment providing a lateral power semiconductor switch including an active drift zone.

FIG. 4 refers to an embodiment of integrating a plurality of the above-described semiconductor device functionalities. For example, instead of electrically connecting a drain layer to a second electrode structure provided at the second surface 102, the drain layer of a first function block may be electrically connected with the source zones of a second function block of the same semiconductor device.

According to an embodiment, a semiconductor device 500 may integrate a plurality of identical function blocks electrically arranged in series or in parallel. The embodiment of FIG. 4 integrates different function blocks for providing an active drift zone in a cascode circuit configuration with one or more first function blocks 510 based on depletion type n-channel field effect transistor cells and a second function block 520 based on enhancement type n-channel field effect transistor cells. A buried drain layer of a preceding function block 510, 520 is electrically connected to both the source zones of the subsequent function block 510 and the gate electrode of a further subsequent function block. Zener or avalanche diodes (Z0, . . . Zn) 530 may be arranged in parallel to the function blocks 510, 520. According to an embodiment, the voltage limiting functionality of the Zener or avalanche diodes 530 may be provided by the function blocks 510, 520, so that no additional devices are necessary.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
    transistor cells arranged at a first pitch and having double-gated and fully depletable vertical channels perpendicular to a first surface of a semiconductor portion;
    a buried compensation structure between the transistor cells and a second surface of the semiconductor portion parallel to the first surface, the compensation structure comprising first areas and second areas alternatingly arranged along a lateral direction parallel to the first surface wherein the first areas are arranged at a second pitch that differs from the first pitch, wherein at least one of: a material composition, and a conductivity type, of the first area, is different from the second area; and
    a contiguous impurity layer of a first conductivity type separating the transistor cells and the compensation structure.

2. The semiconductor device according to claim 1, wherein the first areas have the first conductivity type and the second areas have a complementary, second conductivity type and the first and second areas form pn junctions.

3. The semiconductor device according to claim 2, wherein a laterally integrated impurity concentration in the first areas deviates by not more than 10% from a laterally integrated impurity concentration in the second areas at the same distance to the first surface.

4. The semiconductor device according to claim 1, wherein the second areas are electrically connected with each other and a conductive structure.

5. The semiconductor device according to claim 1, wherein the contiguous impurity layer is structurally connected with the first areas.

6. The semiconductor device according to claim 1, further comprising:
    gate electrodes between the first surface and the contiguous impurity layer; and
    active transistor areas in semiconductor mesas between the gate electrodes.

7. The semiconductor device according to claim 6, wherein the second areas are electrically connected with a first electrode structure electrically connected to source zones in the active transistor areas.

8. The semiconductor device according to claim 6, wherein the gate electrodes are dielectrically insulated from source zones in the active transistor areas.

9. The semiconductor device according to claim 8, wherein
the active transistor areas comprise channel zones of a conductivity type of the first areas, the channel zones structurally connecting the source zones and the contiguous impurity layer, and
a mean net impurity concentration in the source zones exceeds at least five times a mean net impurity concentration in the channel zones.

10. The semiconductor device according to claim 9, wherein
the transistor cells are configured as depletion type field effect transistor cells and gate dielectrics dielectrically insulate the gate electrodes from the channel zones.

11. The semiconductor device according to claim 9, wherein
the transistor cells are configured as junction field effect transistor cells and the gate electrodes directly adjoin the channel zones.

12. The semiconductor device according to claim 8, wherein
the active transistor areas include body zones of a conductivity type opposite to a conductivity type of the first areas, the body zones structurally separating the source zones from a drift layer including the contiguous impurity layer.

13. The semiconductor device according to claim 12, wherein
the transistor cells are configured as enhancement type field effect transistor cells and gate dielectrics dielectrically insulate the gate electrodes from the body zones.

14. The semiconductor device according to claim 1, wherein
the transistor cells are stripe-shaped and longitudinal axes of the transistor cells extend in a first lateral direction parallel to the first surface, and
the second areas are stripe-shaped and longitudinal axes of the second areas extend in a second lateral direction intersecting the first lateral direction.

15. The semiconductor device according to claim 1, further comprising:
dielectric layers which dielectrically insulate the second areas from the first areas.

16. The semiconductor device according to claim 1, wherein
each second area includes at least a first section and a second section, the first and second sections arranged in a vertical direction perpendicular to the first surface.

17. The semiconductor device according to claim 16, wherein
a thickness of a first dielectric layer dielectrically insulating the first sections differs from a thickness of a second dielectric layer dielectrically insulating the second sections.

18. The semiconductor device according to claim 1, further comprising:
a drain layer electrically connected to the first areas and a second electrode structure, the second electrode structure directly adjoining the second surface.

* * * * *